(12) United States Patent
Lim et al.

(10) Patent No.: US 11,749,654 B2
(45) Date of Patent: Sep. 5, 2023

(54) SEMICONDUCTOR DEVICE AND METHOD OF MANUFACTURING SEMICONDUCTOR DEVICE

(71) Applicant: Amkor Technology Singapore Holding Pte. Ltd., Singapore (SG)

(72) Inventors: Gi Tae Lim, Incheon (KR); Jae Yun Kim, Incheon (KR); Myung Jea Choi, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 17/521,750

(22) Filed: Nov. 8, 2021

(65) Prior Publication Data

US 2022/0068897 A1   Mar. 3, 2022

Related U.S. Application Data

(63) Continuation of application No. 16/530,305, filed on Aug. 2, 2019, now Pat. No. 11,171,127.

(51) Int. Cl.

| | |
|---|---|
| *H01L 23/538* | (2006.01) |
| *H01L 25/10* | (2006.01) |
| *H01L 23/498* | (2006.01) |
| *H01L 23/31* | (2006.01) |
| *H01L 23/00* | (2006.01) |
| *H01L 21/56* | (2006.01) |
| *H01L 21/52* | (2006.01) |

(52) U.S. Cl.
CPC ............ *H01L 25/105* (2013.01); *H01L 21/52* (2013.01); *H01L 21/56* (2013.01); *H01L 23/3128* (2013.01); *H01L 23/49822* (2013.01); *H01L 23/49838* (2013.01); *H01L 23/5386* (2013.01); *H01L 24/16* (2013.01); *H01L 24/48* (2013.01); *H01L 2224/16227* (2013.01); *H01L 2224/48227* (2013.01); *H01L 2225/1058* (2013.01)

(58) Field of Classification Search
CPC .......................... H01L 25/105; H01L 23/5386
See application file for complete search history.

(56) References Cited

U.S. PATENT DOCUMENTS

| | | | | |
|---|---|---|---|---|
| 11,171,127 B2* | 11/2021 | Lim | ...................... | H01L 21/561 |
| 2015/0206815 A1* | 7/2015 | Katkar | ................ | H01L 21/4853 |
| | | | | 257/738 |
| 2015/0303158 A1* | 10/2015 | Huang | .............. | H01L 23/49827 |
| | | | | 438/126 |
| 2017/0345764 A1* | 11/2017 | Chang | ................. | H01L 23/5383 |
| 2019/0229046 A1* | 7/2019 | Tsai | ...................... | H01L 21/568 |

(Continued)

*Primary Examiner* — Douglas M Menz
(74) *Attorney, Agent, or Firm* — Spectrum IP Law Group LLC

(57) ABSTRACT

In one example, a semiconductor structure comprises a redistribution structure comprising a conductive structure, a cavity substrate on a top side of the redistribution structure and having a cavity and a pillar contacting the redistribution structure, an electronic component on the top surface of the redistribution structure and in the cavity, wherein the electronic component is electrically coupled with the conductive structure, and an encapsulant in the cavity and on the top side of the redistribution structure, contacting a lateral side of the electronic component, a lateral side of the cavity, and a lateral side of the pillar. Other examples and related methods are also disclosed herein.

23 Claims, 13 Drawing Sheets

(56) References Cited

U.S. PATENT DOCUMENTS

| | | | |
|---|---|---|---|
| 2019/0318994 A1* | 10/2019 | Kweon | H01L 23/5389 |
| 2019/0378795 A1* | 12/2019 | Lee | H01L 24/20 |
| 2020/0006209 A1* | 1/2020 | Wang | H01L 23/5389 |
| 2020/0006307 A1* | 1/2020 | Tsai | H01L 21/566 |
| 2020/0013721 A1* | 1/2020 | Chiang | H01L 21/6835 |
| 2020/0058606 A1* | 2/2020 | Tsai | H01L 21/6835 |
| 2020/0144192 A1* | 5/2020 | Choi | H01L 23/5386 |

* cited by examiner

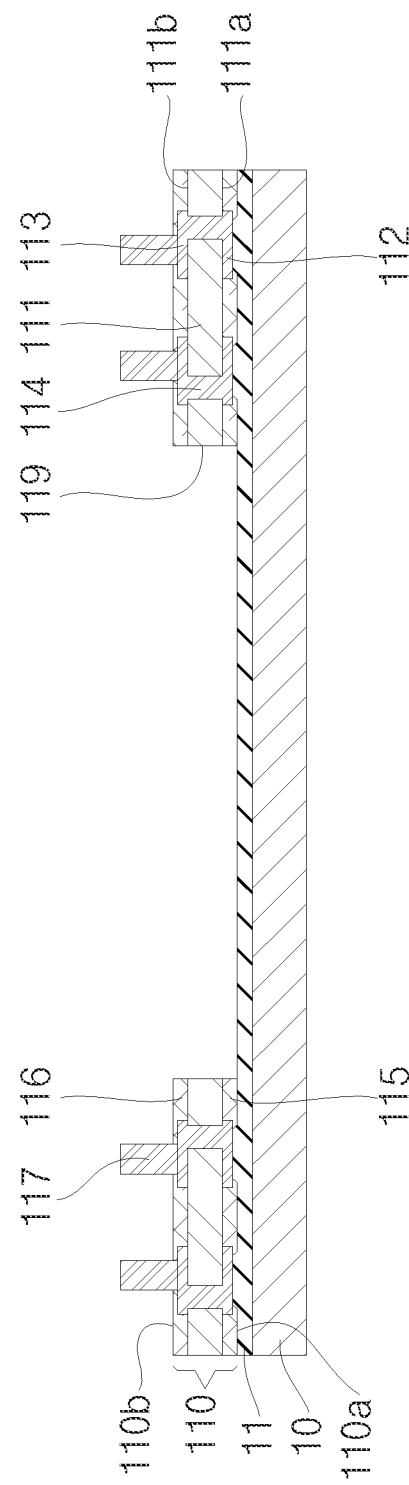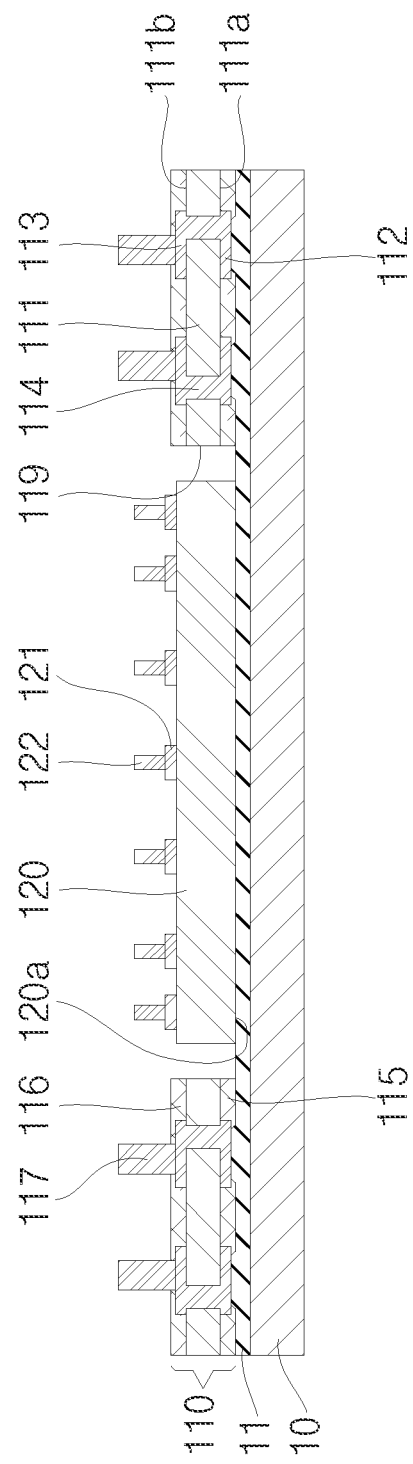

SEMICONDUCTOR DEVICE AND METHOD OF MANUFACTURING SEMICONDUCTOR DEVICE

CROSS-REFERENCE TO RELATED APPLICATIONS

The present application is a continuation of U.S. application Ser. No. 16/530,305 filed Aug. 2, 2019, now U.S. Pat. No. 11,171,127. Said application Ser. No. 16/530,305 and said U.S. Pat. No. 11,171,127 are hereby incorporation herein by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIG. 2A to FIG. 2G show cross-sectional views of an example method for manufacturing an example semiconductor device.

Figure 1:
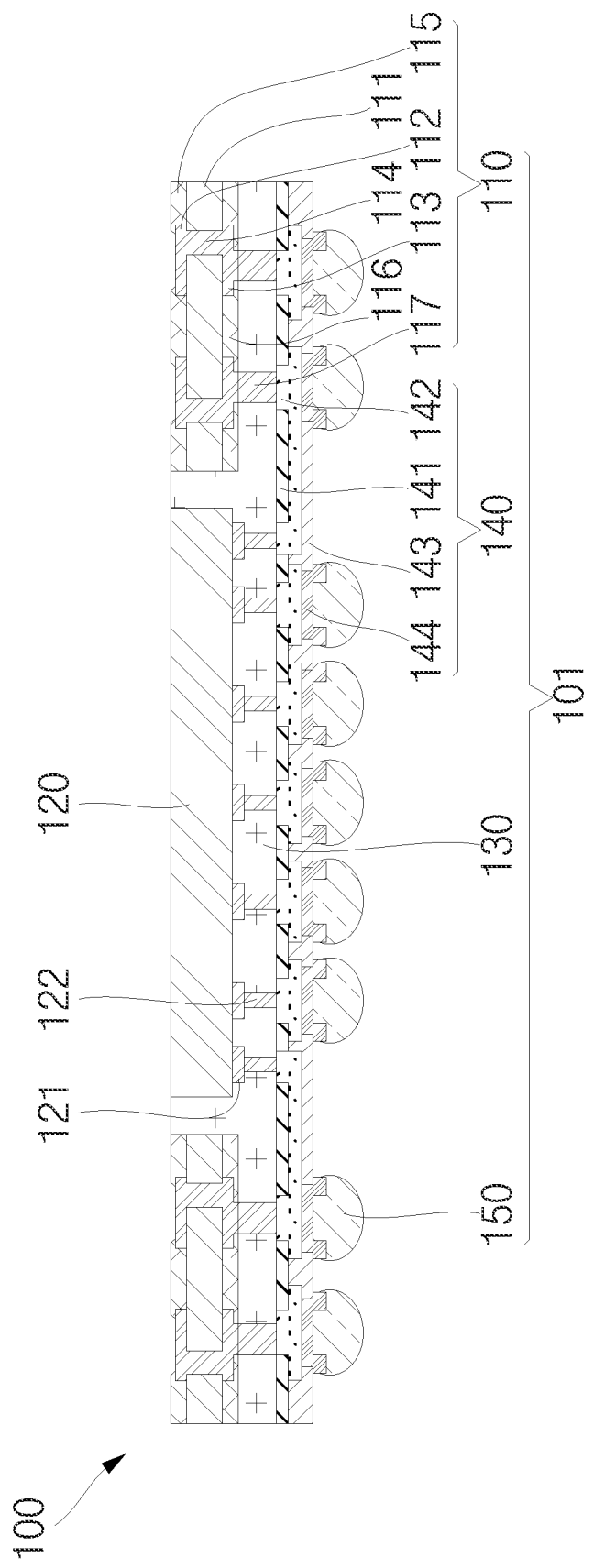
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements. Geometrical descriptive terms, such as coplanar, planar, perpendicular, vertical, horizontal, among others, encompass not only such exact terms, but also substantial approximations of such terms, for example, within manufacturing tolerances.

DESCRIPTION

In one example, a semiconductor structure comprises a redistribution structure comprising a conductive structure, a cavity substrate on a top side of the redistribution structure and having a cavity and a pillar contacting the redistribution structure, an electronic component on the top surface of the redistribution structure and in the cavity, wherein the electronic component is electrically coupled with the conductive structure, and an encapsulant in the cavity and on the top side of the redistribution structure, contacting a lateral side of the electronic component, a lateral side of the cavity, and a lateral side of the pillar.

In another example, a method to manufacture a semiconductor structure comprises providing a cavity substrate having a cavity and a substrate interconnect, placing an electronic component having a component interconnect in the cavity of the cavity substrate, providing an encapsulant in the cavity on a top side of the cavity substrate and contacting a lateral side of the electronic component, the substrate interconnect, and the component interconnect, and providing a redistribution structure on the top side of the cavity substrate, wherein the redistribution structure has a conductive structure coupled with the substrate interconnect.

In a further example, a semiconductor structure comprises a first semiconductor device comprising a redistribution structure comprising a conductive structure, a first substrate on a top side of the redistribution structure and having a cavity and a pillar contacting the redistribution structure, an electronic component on the top surface of the redistribution structure and in the cavity, wherein the electronic component is electrically coupled with the conductive structure via a component interconnect, and an encapsulant in the cavity and on the top side of the redistribution structure bounding a lateral side of the electronic component and the pillar. The semiconductor structure also comprises a second semiconductor device on a top side of the first semiconductor device, wherein the second semiconductor device is electrically coupled with a substrate land on a top side of the first substrate.

Other examples are included in the present disclosure. Such examples may be found in the figures, in the claims, and/or in the description of the present disclosure.

FIG. 1 shows a cross-sectional view of an example semiconductor device. In the example shown in FIG. 1, semiconductor device 100 can comprise substrate 110, electronic component 120, encapsulant 130, redistribution structure 140 and external interconnects 150.

Substrate 110 can comprise insulation layer 111, conductive pads 112 and 113, conductive path 114, dielectric layers 115 and 116 and substrate interconnects 117. Electronic component 120 can comprise component interconnects 122. Redistribution structure 140 can comprise dielectric structures 141 and 143 and conductive structures 142 and 144.

Substrate 110, encapsulant 130, redistribution structure 140 and external interconnects 150 can comprise or be referred to as semiconductor package 101 or package 101, and semiconductor package 101 can provide protection for electronic component 120 from external elements and/or environmental exposure. In addition, semiconductor package 101 can provide electrical coupling between an external component and electronic component 120.

In some examples, the top side of electronic component 120 can be coplanar with the top side of encapsulant 130. In some examples, coplanar can mean that the top side of electronic component can generally lie in the same plane as the top side of encapsulant 130 within manufacturing tolerance. For instance, the top side of electronic component 120 can protrude slightly above the top side of encapsulant 130, or the top side of electronic component 120 can be recessed slightly with respect to the top side of encapsulant 130, while remaining coplanar within such tolerance. It should be noted that these are merely examples describing the relationship between the top side of electronic component and the top side of encapsulant 130, and the scope of the disclosure is not limited in these respects.

In some examples, redistribution structure 140 can comprise a conductive structure 142 or 144, and substrate 110 can comprise a cavity substrate on a top side of redistribution structure 140 having a cavity 119 filled with encapsulant 130 and a pillar 117 contacting redistribution structure 140. Electronic component 120 can be on the top surface of redistribution structure 140 and in the cavity 119, wherein the electronic component 120 is electrically coupled with conductive structure 142 or 144. The encapsulant can be in the cavity 119 and on the top side of 140 redistribution structure, contacting a lateral side of the electronic component 120, a lateral side of the cavity 119, and a lateral side of the pillar 117.

Figure 3A:
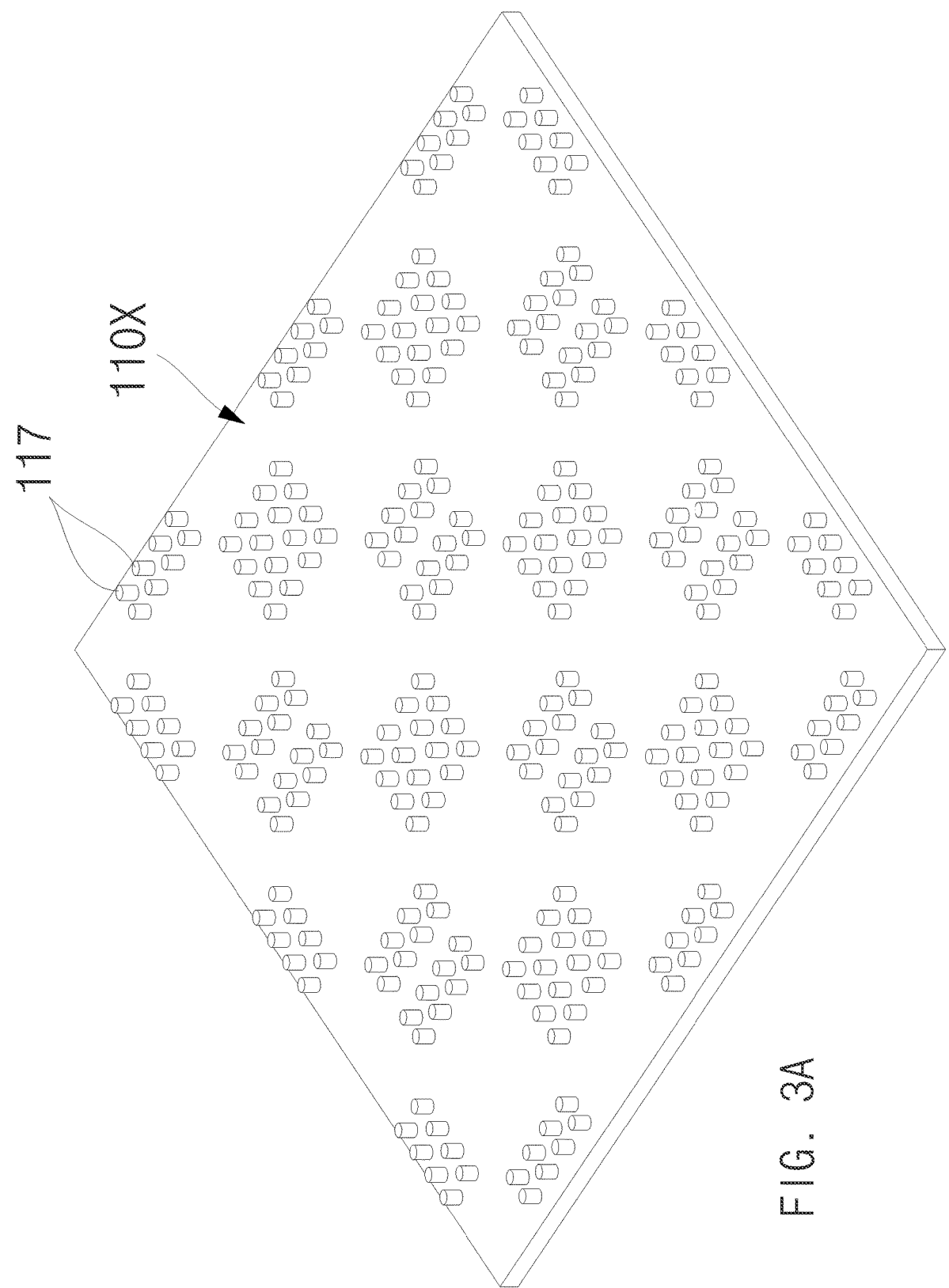
FIG. 3A to FIG. 3C show perspective views of an example method for forming a substrate.
Figure 3B:
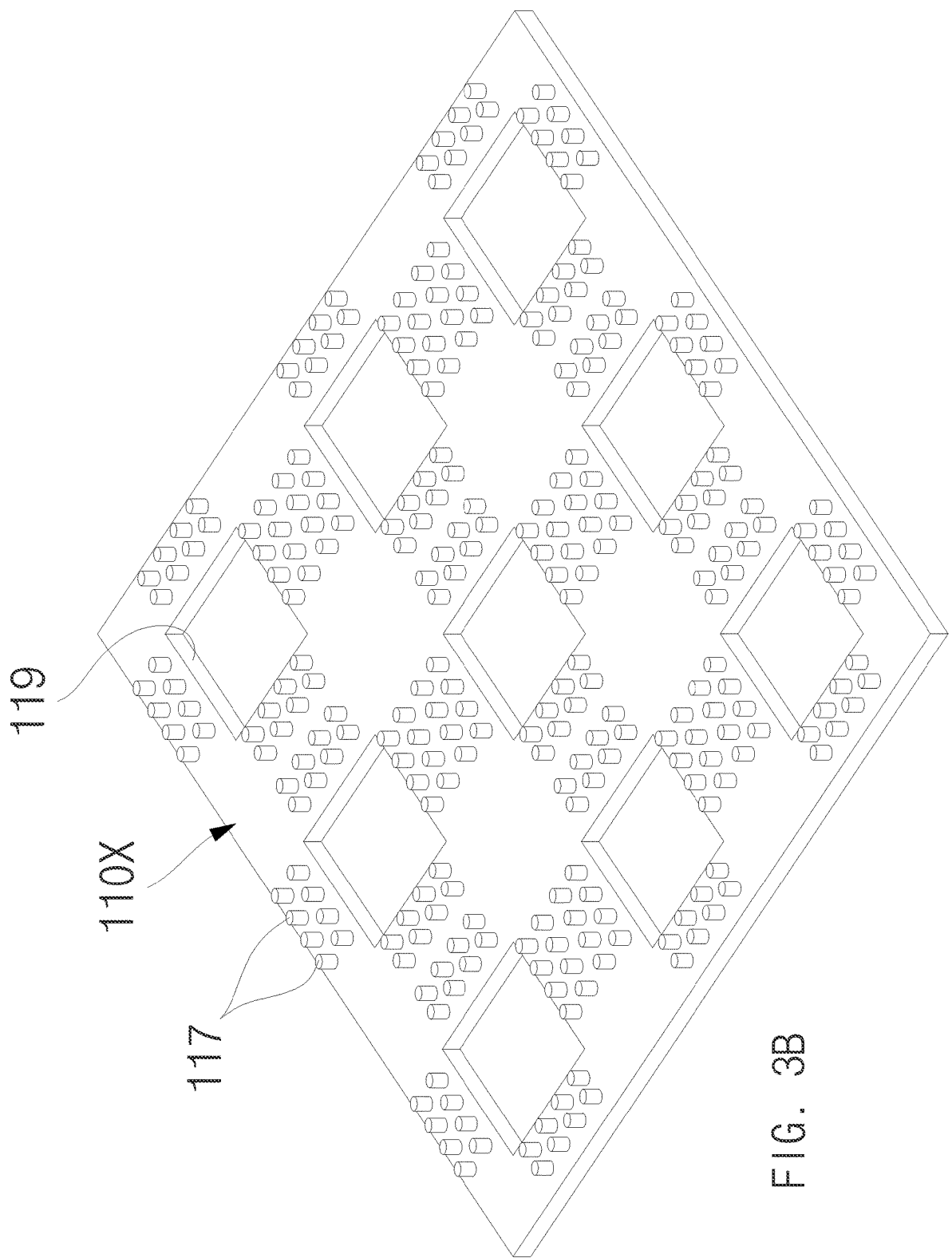
Figure 3C:
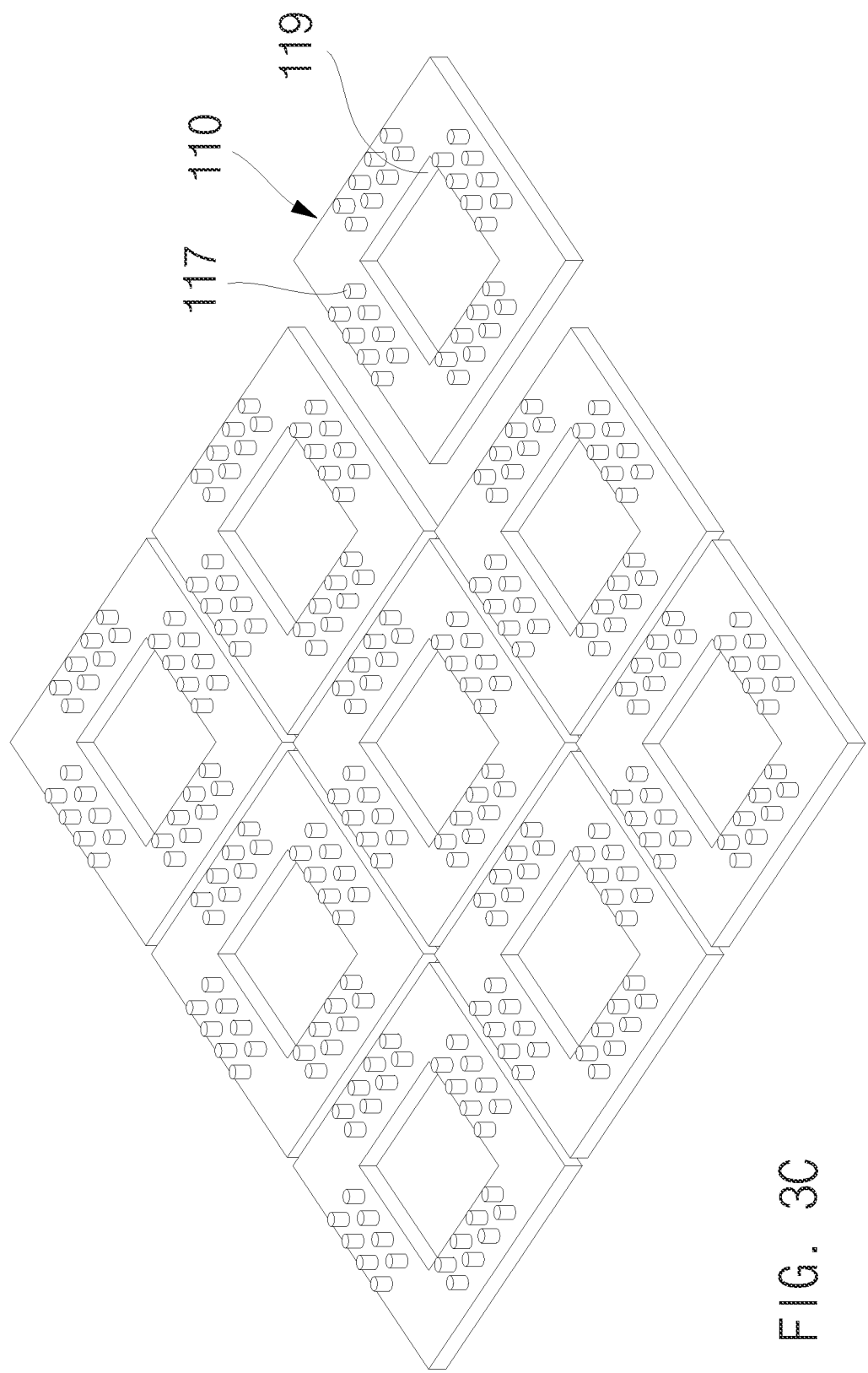
Figure 4A:
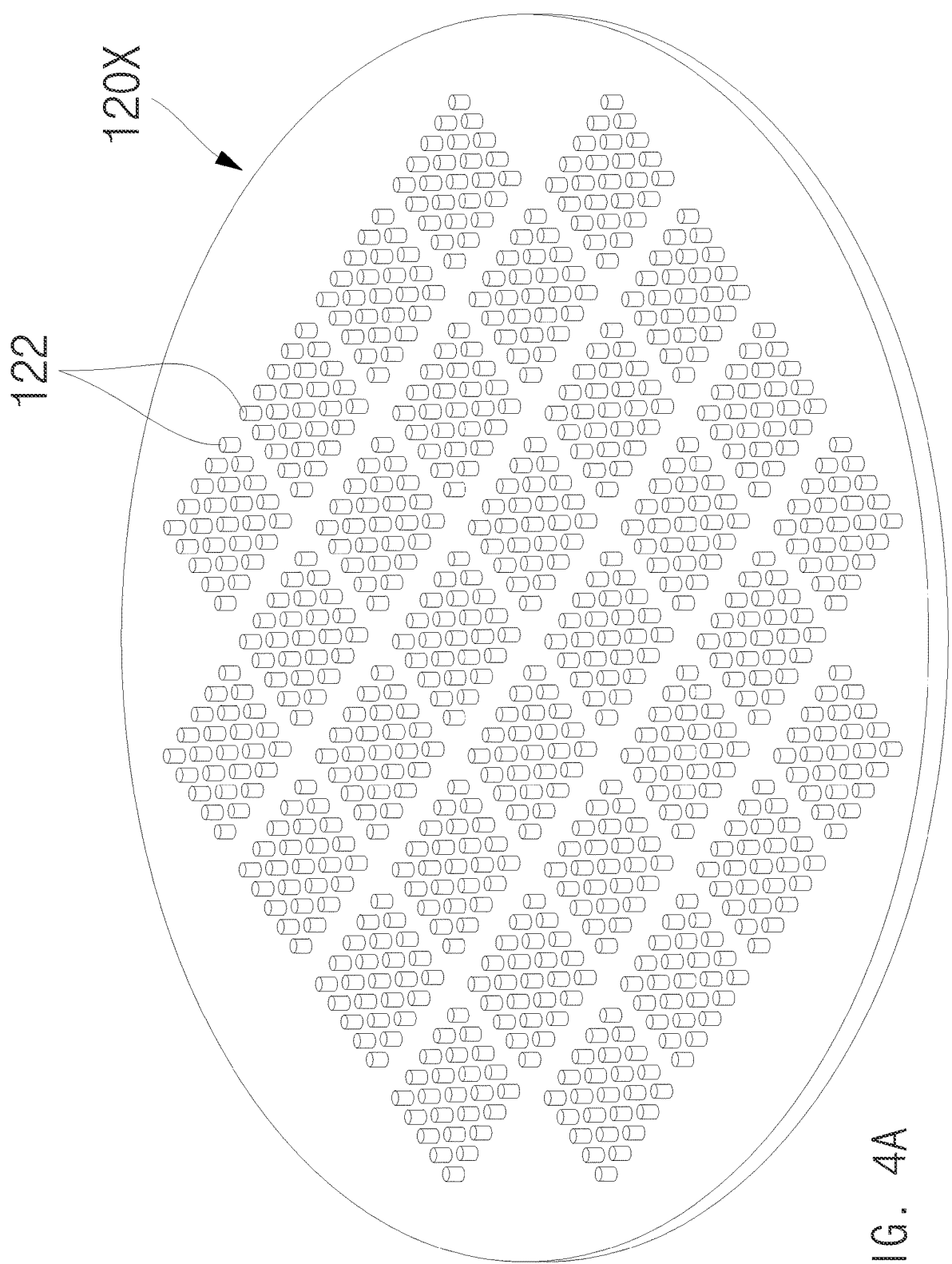
FIG. 4A and FIG. 4B show perspective views of an example method for forming an electronic component.
Figure 4B:
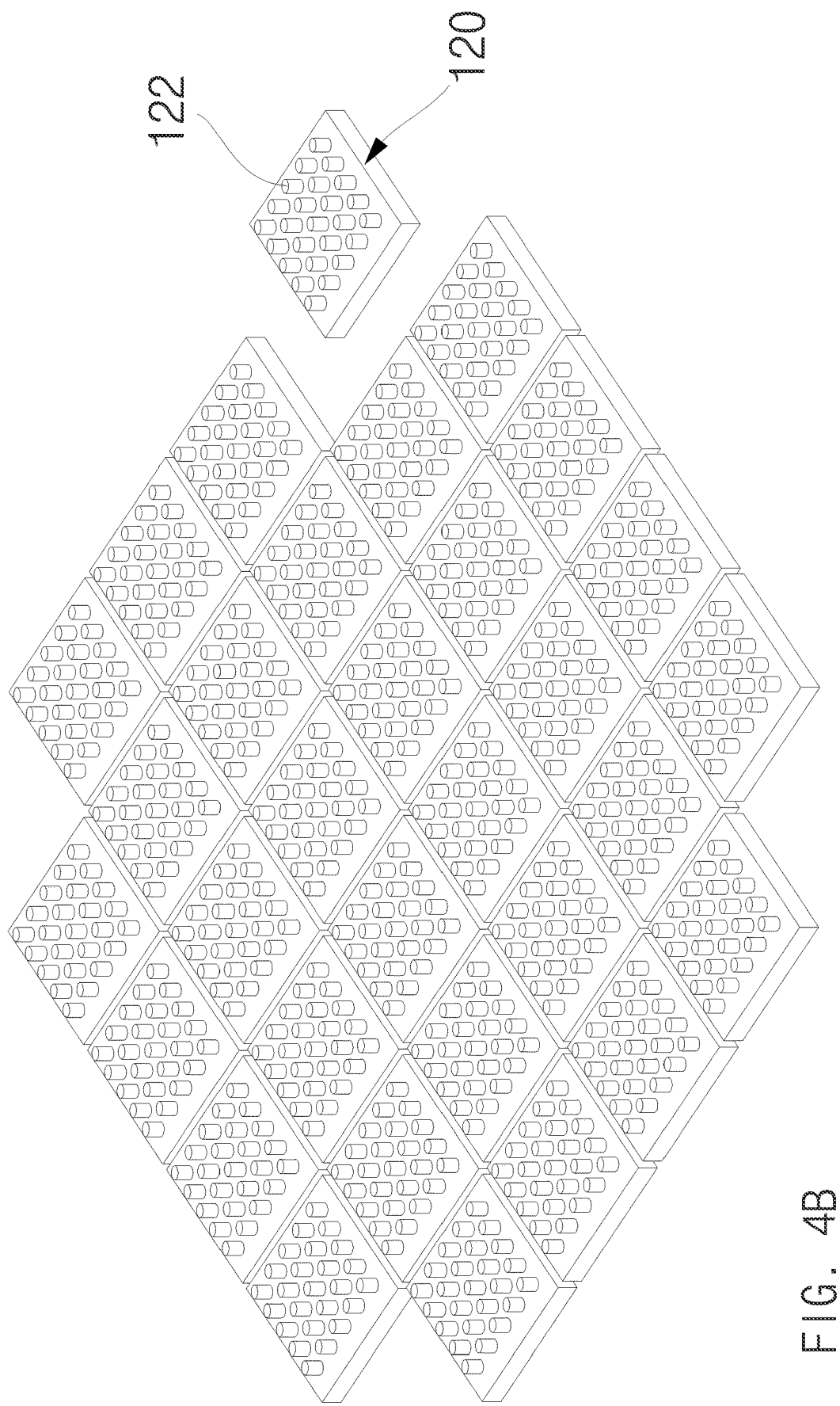

FIGS. 2A to 2G show cross-sectional views of an example method for manufacturing an example semiconductor device 100. FIGS. 3A to 3C show perspective views of an example method for forming substrate 110 shown in FIG. 2A. FIGS. 4A and 4B show perspective views of an example method for forming electronic component 120 shown in FIG. 2B.

FIG. 2A shows a cross-sectional view of semiconductor device 100 at an early stage of manufacture. FIG. 3A to FIG. 3C show perspective views of an example method for forming substrate 110.

In the example shown in FIG. 2A, a carrier 10 can be a substantially planar plate. In some examples, carrier 10 can comprise or be referred to as a board, a wafer, a panel, or a strip. In some examples, carrier 10 can comprise, for example, but is not limited to, steel, stainless steel, aluminum, copper, ceramic, glass, semiconductor, or a wafer. Carrier 10 can have a thickness in the range from approximately 1 millimeter (mm) to approximately 1.5 mm and a width in the range from approximately 200 mm to approximately 320 mm.

Carrier 10 can function to handle multiple components in an integrated manner for attaching substrate 110 to electronic component 120, forming encapsulant 130, and forming redistribution structure 140. Carrier 10 can be commonly applied to different examples disclosed in the present disclosure. Electronic component 120 can have a component interconnect 122 and can be placed in the cavity 119 of the cavity substrate 110. An encapsulant 130 can be provided in the cavity 119 on the top side of the cavity substrate 110 wherein the encapsulant 130 can contact a lateral side of the electronic component 120, a lateral side of the substrate interconnect 117, and a lateral side of the component interconnect 122. Redistribution structure 140 can then be provided on the top side of the cavity substrate 110. Redistribution structure 140 can have a conductive structure 144 or 144 coupled with the substrate interconnect 117.

Temporary bond layer 11 can be provided on a surface of carrier 10. Temporary bond layer 11 can be provided on the surface of carrier 10 using a coating process such as spin coating, doctor blade, casting, painting, spray coating, slot die coating, curtain coating, slide coating, or knife over edge coating; a printing process, such as screen printing, pad printing, gravure printing, flexographic coating or offset printing; an inkjet printing process; or direct attachment of an adhesive film or an adhesive tape. Temporary bond layer 11 can comprise or be referred to as a temporary adhesive film or a temporary adhesive tape. Temporary bond layer 11 can be, for example, but is not limited to, a thermally releasable film or an ultraviolet (UV) releasable film, which can be weakened in its bonding strength, or can be removed by, heat or UV irradiation. In some examples, temporary bond layer 11 can have a weakened bonding strength or can be removed by physical and/or chemical external forces. Temporary bond layer 11 can have a thickness in the range from approximately 50 micrometers (μm) to approximately 100 μm. Temporary bond layer 11 can allow carrier 10 to be separated after the formation of redistribution structure 140 which will later be described. Temporary bond layer 11 can be commonly applied to different examples disclosed in the present disclosure.

Substrate 110 having substrate interconnects 117 and defining cavity 119 can be attached to temporary bond layer 11. Substrate 110 can comprise insulation layer 111, conductive pads 112 and 113, conductive path 114, dielectric layers 115 and 116 and substrate interconnects 117. In some examples, at least one of conductive pads 112 and 113, conductive path 114, or dielectric layers 115 and 116 can be omitted. In addition, substrate 110 can comprise cavity 119 extending through a region between top surface 110b and bottom surface 110a.

In some examples, substrate 110 can comprise or be referred to as a printed circuit board (PCB), a cavity substrate, a printed wiring board, a multi-layered substrate, a through hole substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate or a pre-molded lead frame. In some examples, a cavity substrate 110 can be provided having a cavity 119 and a substrate interconnect 117.

In some examples, insulation layer 111 can have top surface 111b and bottom surface 111a that are substantially planar. In some examples, insulation layer 111 can comprise or be referred to as a dielectric layer or a core layer. In some examples, insulation layer 111 can comprise epoxy resin, phenolic resin, glass epoxy, polyimide, polyester, an epoxy molding compound, or silicon resin, or ceramic. In some examples, insulation layer 111 can have a thickness in the range from approximately 10 μm to approximately 500 μm. Insulation layer 111 can maintain substrate 110 at a substantially planar state or can restrict bending, and also can provide insulation between conductors of substrate 110.

Conductive pads 112 can be formed on bottom surface 111a of insulation layer 111, and conductive pads 113 can be formed on top surface 111b of insulation layer 111. Conductive pads 112 and 113 can be formed on bottom surface 111a and top surface 111b of insulation layer 111 in a matrix configuration having rows and/or columns. In some examples, conductive pads 112 or 113 can comprise or be referred to as conductors, conductive material, substrate lands, conductive lands, substrate pads, wire pads, connection pads, micro pads, traces, or under-bump-metallurgies (UBMs). In some examples, substrate lands 112 and substrate pads 113 can comprise copper, iron, nickel, gold, silver, palladium, or tin. In some examples, substrate lands 112 and substrate pads 113 can have a thickness, width, and space in the range from approximately 50 μm to approximately 500 μm.

In some examples, conductive path 114 can electrically connect substrate lands 112 and substrate pads 113 while extending through insulation layer 111. In some examples, conductive path 114 can comprise or be referred to as a conductor, a conductive material, a conductive via, a circuit pattern, or a conductive post. In some examples, conductive path 114 can comprise copper, iron, nickel, gold, silver, palladium, or tin. In some examples, conductive path 114 can have a thickness in the range from approximately 10 μm to approximately 500 μm.

As shown in FIG. 2A and FIG. 2B, dielectric layer 115 can roughly cover portions of substrate lands 112 and bottom surface 111a of insulation layer 111, and dielectric layer 116 can roughly cover portions of substrate pads 113 and top surface 111b of insulation layer 111. In some examples, dielectric layers 115 and 116 can comprise or be referred to as dielectrics, dielectric materials, dielectric layers, insulation layers, solder masks, or solder resists. In some examples, portions of substrate lands 112 to be connected to another semiconductor device can be exposed through dielectric layer 115. In addition, portions of substrate pads 113 to be connected to substrate interconnects 117 can be exposed thorough dielectric layer 116. In some examples, dielectric layers 115 and 116 can comprise polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric layers 115 and 116 can have a thickness in the range from approximately 10 μm to approximately 100 μm. Dielectric layer 115 can serve to protect conductors proximate to bottom surface 110a of substrate 110, and dielectric layer 116 can serve to protect conductors proximate to top surface 110b of substrate 110.

FIG. 2A and FIG. 3A show an example method for forming or providing substrate interconnects 117 on substrate 110X. Substrate 110X can be used for manufacturing a multitude of individual substrates 110 having a multitude of substrate interconnects 117 and a multitude of cavities 119 at a time.

In the example shown in FIG. 2A and FIG. 3A, substrate 110, including insulation layer 111, substrate lands 112, substrate pads 113, conductive path 114 and dielectric layers 115 and 116, can have substrate interconnects 117 electrically connected to substrate pads 113.

Substrate interconnects 117 can be formed on top surfaces of substrate pads 113. Like substrate pads 113, substrate interconnects 117 can be formed in a matrix configuration having rows or columns. Substrate interconnects 117 can be formed to upwardly extend from substrate pads 113. In some examples, substrate interconnects 117 can have a height in the range from approximately 0.1 mm to approximately 0.5 mm and a width in the range from approximately 0.2 mm to approximately 1 mm.

In some examples, substrate interconnects 117 can be formed by, but not limited to, electroplating, electroless plating, sputtering, PVD, CVD, MOCVD, ALD, LPCVD, or PECVD. In some examples, substrate interconnects 117 can comprise copper, gold, silver, palladium, nickel, or solder. Substrate interconnects 117 can comprise or be referred to as pillars, posts, columns, vias, vertical wires, bumps, or conductive paths. In some examples, substrate interconnects 117 can electrically and mechanically connect redistribution structure 140 to be described later to substrate 110.

FIG. 2A and FIG. 3B show an example method for forming cavities 119 on substrate 110X. In the example shown in FIG. 2A and FIG. 3B, cavities 119 extending through top surface 110b and bottom surface 110a of substrate 110X can be formed on substrate 110X. Cavities 119 can be formed in a matrix configuration having rows or columns. Cavities 119 can be formed in a rectangular shape or a shape to correspond to electronic component 120. Cavities 119 can be formed in regions including insulation layer 111 and dielectric layers 115 and 116 in substrate 110X. Substrate interconnects 117 can be positioned on top surface 110b of substrate 110X so as to be spaced apart from one another in row and/or column directions around cavities 119. In some examples, cavities 119 can have a size in the range from approximately 1 mm to approximately 10 mm.

FIGS. 2A and 3C show an example method for singulating substrate 110X into individual substrates 110 each having a cavity 119. In some examples, substrate 110X can be singulated into individual substrates 110 using a diamond blade or laser beam. Bottom surface 110a of each of individual substrates 110 having one cavity 119 can be attached to carrier 10 shown in FIG. 2A through temporary bond layer 11. Substrate 110 can have cavity 119 positioned roughly at its center or can be a rectangular ring. In addition, substrate interconnects 117 spaced apart from one another in row or column directions can be positioned outside the respective sides of cavity 119 formed on top surface of substrate 110.

FIG. 2B shows a cross-sectional view of semiconductor device 100 at a later stage of manufacture. FIG. 4A and FIG. 4B show perspective views of an example method for forming or providing electronic component 120. In the example shown in FIG. 2B, electronic component 120 having component interconnects 122 can be attached to temporary bond layer 11 of carrier 10. A multitude of terminals 121 can be provided on a top surface of electronic component 120, and component interconnects 122 can be electrically connected to multitude of terminals 121, respectively. Terminals 121 can be input/output terminals of electronic component 120 and can comprise or be referred to as die pads or bond pads. In some examples, terminals 121 can have a width in the range from approximately 50 μm to approximately 500 μm.

FIG. 4A shows an example method for forming component interconnects 122 to be electrically connected to terminals 121 of electronic component 120. In the example shown in FIG. 2B and FIG. 4A, wafer 120X having electronic components 120 can be prepared, and component interconnects 122 can be formed on a top surface of wafer 120X to be electrically connected to terminals 121 of electronic components 120. Component interconnects 122 can be formed on top surfaces of terminals 121, respectively. In addition, component interconnects 122 can be formed during fabrication of wafer 120X.

Like terminals 121, component interconnects 122 can be formed in a matrix configuration having rows or columns. Component interconnects 122 can be formed to upwardly extend from terminals 121. In some examples, component interconnects 122 can have a height in the range from approximately 20 μm to approximately 150 μm and a width in the range from approximately 0.05 mm to approximately 1 mm. Component interconnects 122 are formed or provided during fabrication of wafer 120X, and sizes and widths of component interconnects 122 can be smaller than those of substrate interconnects 117.

In some examples, component interconnects 122 can be formed by, but not limited to, electroplating, electroless plating, sputtering, PVD, CVD, MOCVD, ALD, LPCVD, or PECVD. In some examples, component interconnects 122 can comprise copper, gold, silver, palladium, nickel, or solder. Component interconnects 122 can comprise or be referred to as pillars, posts, columns, bumps, or conductive paths. In some examples, component interconnects 122 can electrically and mechanically connect redistribution structure 140 to be described later to electronic component 120.

FIG. 4B shows an example method for singulating wafer 120X having component interconnects 122 into individual electronic components 120. In the example shown in FIG. 2B and FIG. 4B, wafer 120X having component interconnects 122 can be singulated into individual electronic components 120. In some examples, wafer 120X can be divided into individual electronic components 120 using a diamond blade or laser beam.

A bottom surface 120a of each of electronic components 120 having component interconnects 122 can be attached to carrier 10 shown in FIG. 2B through temporary bond layer 11. Electronic component 120 can be positioned within cavity 119 of substrate 110. Electronic component 120 can have a smaller size than cavity 119. Side surfaces of electronic component 120 can be spaced apart from substrate 110.

Electronic component 120 can comprise or be referred to as a semiconductor die, a semiconductor chip, or a semiconductor package, such as a chip-scale package. In some examples, electronic component 120 can comprise at least one of an application specific integrated circuit, a logic die, a micro control unit, a memory, a digital signal processor, a network processor, a power management unit, an audio processor, a radio-frequency (RF) circuit, or a wireless baseband system on chip processor. Electronic component 120 can have a thickness in the range from approximately 50 μm to approximately 780 μm. Electronic component 120 can have a size in the range from approximately 3 mm to approximately 10 mm.

Figure 2C:
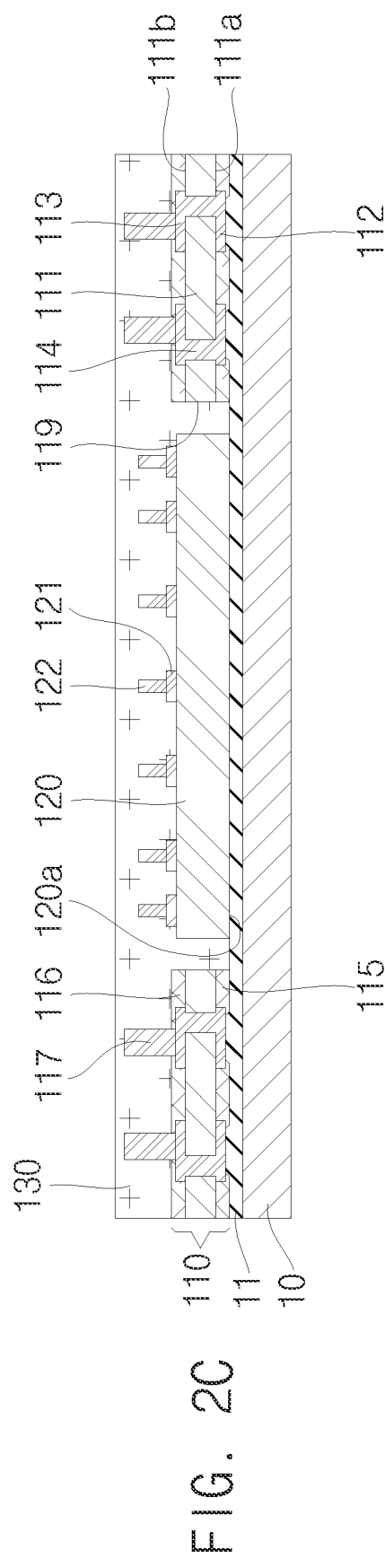

FIG. 2C shows a cross-sectional view of semiconductor device 100 at a later stage of manufacture. In the example shown in FIG. 2C, encapsulant 130 can be formed to entirely cover substrate 110 and electronic component 120. In some examples, encapsulant 130 can contact top surface 110b of substrate 110, can fill cavity 119, and contact side surfaces and top surfaces of substrate interconnects 117. In some examples, encapsulant 130 can contact side surfaces of electronic component 120 or can contact both side surfaces and top surfaces of component interconnects 122.

In some examples, encapsulant 130 can comprise or be referred to as an epoxy molding compound, an epoxy resin, a protective dielectric, or a sealant. In addition, in some examples, encapsulant 130 can comprise or be referred to as a molding part, a sealing part, an encapsulation part, a protection part, or a package body. In some examples, encapsulant 130 can comprise, but is not limited to, an organic resin, an inorganic filler, a curing agent, a catalyst, a coupling agent, a colorant, or a flame retardant. Encapsulant 130 can be formed by any of a variety of processes. In some examples, encapsulant 130 can be formed by, but not limited to, compression molding, transfer molding, liquid-phase encapsulant molding, vacuum lamination, paste printing, or film assist molding. Encapsulant 130 can have a thickness in the range from approximately 0.1 mm to approximately 1 mm. Encapsulant 130 can be formed to cover substrate 110 and electronic component 120 to protect substrate 110 and electronic component 120 from external elements and/or environmental exposure.

Figure 2D:
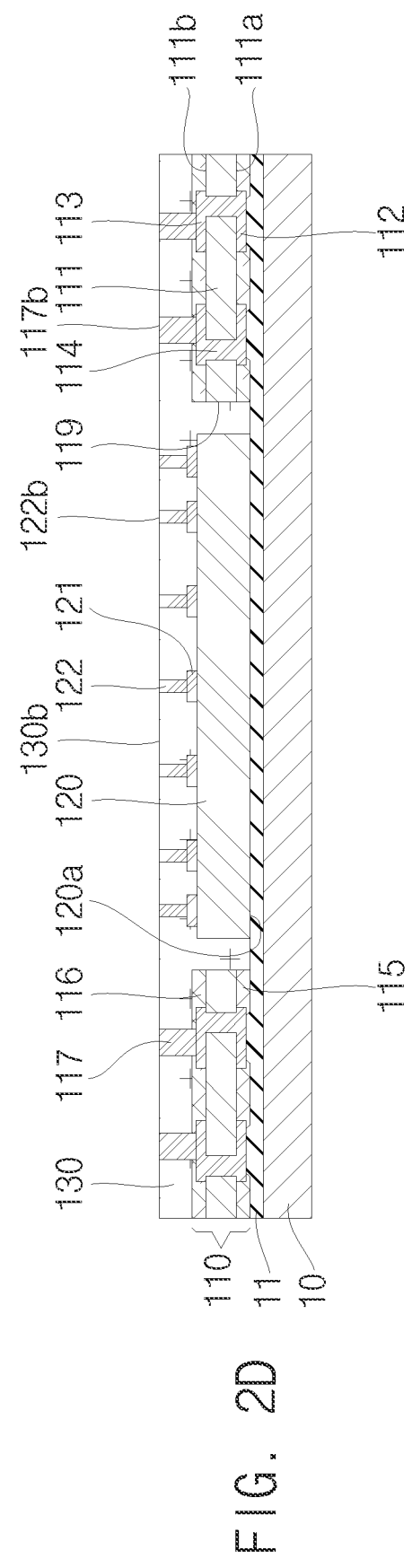

FIG. 2D shows a cross-sectional view of semiconductor device 100 at a later stage of manufacture. In the example shown in FIG. 2D, an upper portion of encapsulant 130 can be removed to expose top surfaces 117b of substrate interconnects 117 and top surfaces 122b of component interconnects 122 at top surface 130b of encapsulant 130. Encapsulant 130 can be removed by grinding or chemical etching. Upper portions of substrate interconnects 117 and upper portions of component interconnects 122 can also be removed. Top surface 130b of encapsulant 130 can be coplanar with top surfaces 117b of substrate interconnects 117 and top surfaces 122b of component interconnects 122. Encapsulant 130 having its upper portion removed can have a thickness in the range from approximately 10 μm to approximately 100 μm.

Figure 2E:
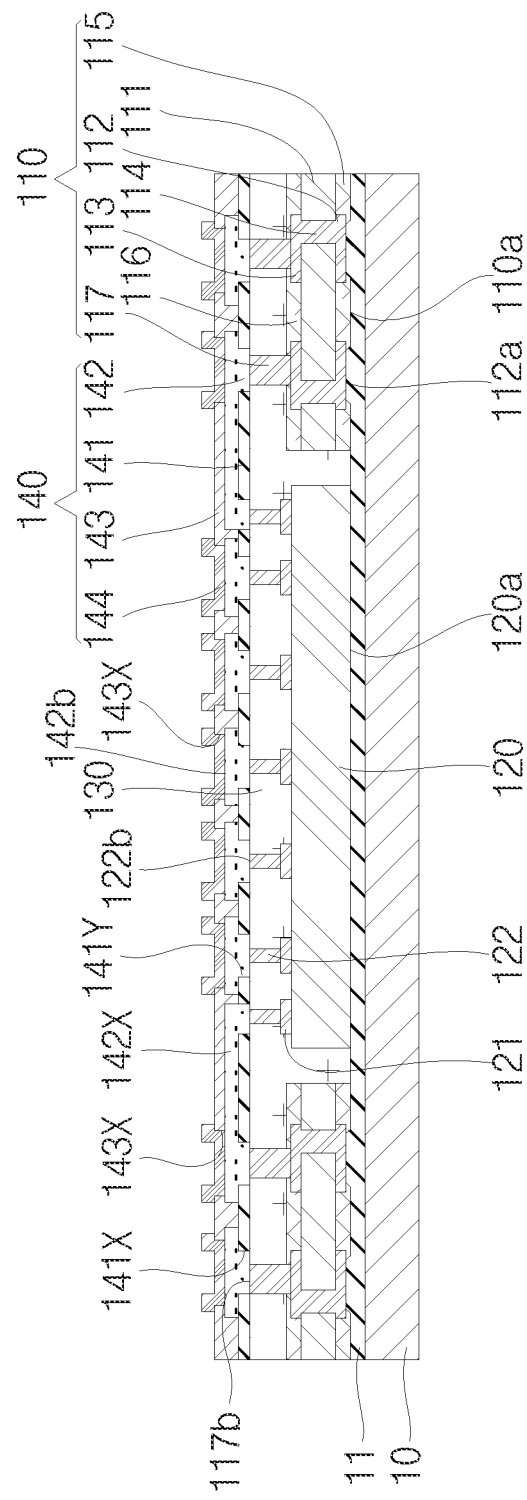

FIG. 2E shows a cross-sectional view of semiconductor device 100 at a later stage of manufacture. In the example shown in FIG. 2E, redistribution structure 140 can be formed on top surface 130b of encapsulant 130, top surfaces 117b of substrate interconnects 117, and top surfaces 122b of component interconnects 122. In some examples, redistribution structure 140 can be similar to substrate 110, or can comprise or be referred to as a substrate. Redistribution structure 140 can comprise first dielectric structure 141, first conductive structure 142, second dielectric structure 143, and second conductive structure 144 sequentially formed. In redistribution structure 140, first dielectric structure 141 can be first formed to cover top surface 130b of encapsulant 130, top surfaces 117b of substrate interconnects 117 and top surfaces 122b of component interconnects 122 to a substantially uniform thickness. In addition, apertures 141X and 141Y can be formed in first dielectric structure 141 to expose top surfaces 117b of substrate interconnects 117 and top surfaces 122b of component interconnects 122.

First dielectric structure 141 or second dielectric structure 143 can comprise or be referred to as a dielectric, a dielectric material, a dielectric layer, a passivation layer, an insulation layer or a protection layer. In some examples, first dielectric structure 141 or second dielectric structure 143 can comprise, but are not limited to, an electrically insulating material, such as a polymer, polyimide (PI), benzocyclobutene (BCB), polybenzoxazole (PBO), bismaleimide triazine (BT), a molding material, a phenolic resin, an epoxy, silicone, or an acrylate polymer. In addition, in some examples, first dielectric structure 141 or second dielectric structure 143 can be formed by any of a variety of processes. In some examples, first dielectric structure 141 or second dielectric structure 143 can be formed by spin coating, spray coating, printing, PVD, CVD, MOCVD, ALD, LPCVD, or PECVD. First dielectric structure (i.e., passivation layer) 141 or second dielectric structure 143 can have a thickness in the range from approximately 1 μm to approximately 20 μm.

In some examples, a mask pattern can be formed on a top surface of first dielectric structure 141, and areas of first dielectric structure 141 can then be removed by etching, forming apertures 141X and 141Y. Apertures 141X and 141Y can comprise or be referred to as openings or holes. First dielectric structure 141 can expose top surfaces 117b of substrate interconnects 117 through aperture 141X and can expose top surfaces 122b of component interconnects 122 through aperture 141Y. In some examples, a photoresist can be used as the mask pattern. Top surfaces 117b of substrate interconnects 117 and top surfaces 122b of component interconnects 122, which are exposed by apertures 141X and 141Y, can have circular, rectangular, or polygonal shapes.

Redistribution structure 140 can have first conductive structure 142 formed to cover top surface of first dielectric structure 141 and top surfaces 117b of substrate interconnects 117 and top surfaces 122b of component interconnects 122, which are exposed by apertures 141X and 141Y.

First conductive structure 142 can be formed with a multitude of conductors, traces, or patterns, and the respective conductors can be brought into contact with top surfaces 117b of substrate interconnects 117, or top surfaces 122b of component interconnects 122, as exposed by apertures 141X and 141Y. Conductors or first conductive structure 142 can be electrically connected to substrate 110 through substrate interconnects 117, or to electronic component 120 through component interconnects 122. First conductive structure 142 can comprise conductors 142X electrically connecting top surfaces 117b of substrate interconnects 117 with top surfaces 122b of component interconnects 122. Conductor 142X can extend from a point over electronic component 120 to a point over substrate 110 and can electrically connect electronic component 120 and substrate 110 to each other.

In some examples, first conductive structure 142 or second conductive structure 144 can comprise or be referred to as a conductor, a conductive material, a conductive layer, a redistribution layer (RDL), a wiring pattern, a trace pattern, or a circuit pattern. In some examples, conductor 142X can comprise or be referred to as a fan-out path, extending both within and past the footprint of electronic component 120. In some examples, first conductive structure 142 or second conductive structure 144 can be made from any of a variety of conductive materials including, for example, copper, gold, silver, or equivalents. First conductive structure 142 or second conductive structure can be formed by any of a variety of processes including, for example, sputtering, electroless plating, electroplating, PVD, CVD, MODVD, ALD, LPCVD, PECVD, or equivalents. First conductive structure 142 can be formed to a predetermined thickness to cover top surface of first dielectric structure 141, top surfaces 117b of substrate interconnects 117 and top surfaces 122b of component interconnects 122, which are exposed by apertures 141X and 141Y, and can be patterned through a mask pattern to define a multitude of conductors. First conductive structure 142 can have a thickness in the range from approximately 5 μm to approximately 50 μm.

Redistribution structure 140 can have second dielectric structure 143 formed to cover first dielectric structure 141 and first conductive structure 142 to a substantially uniform thickness. Apertures 143X exposing top surfaces 142b of first conductive structure 142 can be formed in second dielectric structure 143. Second dielectric structure 143 can also expose top surfaces of conductors 142X through apertures 143X. Second dielectric structure 143 can be similar to first dielectric structure 141 and can be similarly formed as first dielectric structure 141.

Redistribution structure 140 can have second conductive structure 144 formed to cover top surfaces 142b of first conductive structure 142 exposed through apertures 143X. Second conductive structure 144 can be formed with a multitude of conductors, traces, or patterns, and the respective conductors can be brought into contact with top surface 142b of first conductive structure 142 as exposed by aperture 143X. Second conductive structure 144 can be formed to partially cover a top surface of second dielectric structure 143. Second conductive structure 144 can be electrically connected to substrate interconnects 117 and/or component interconnects 122 through first conductive structure 142. Second conductive structure 144 can comprise or be referred to as a conductor, a conductive material, a conductive layer, a conductive pad, a micro pad, a bond pad, a conductive post or an under-bump-metallurgy (UBM). Second conductive structure 144 can be similar to first conductive structure 142 and can be similarly formed as first conductive structure 142. Redistribution structure 140 comprising two dielectric structures 141 and 143 and two conductive structures 142 and 144 is illustrated as an example, but redistribution structure 140 can comprise fewer or more than dielectric structures 141 and 143 or conductive structures 142 and 144.

Substrate 140 is presented as a redistribution layer ("RDL") substrate in the present example. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bis-maleimide triazine (BT) or FR4 and these types of RDL substrates can be referred to as a coreless substrate. Other substrates in this disclosure can also comprise an RDL substrate.

In some examples, substrate 140 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

Figure 2F:
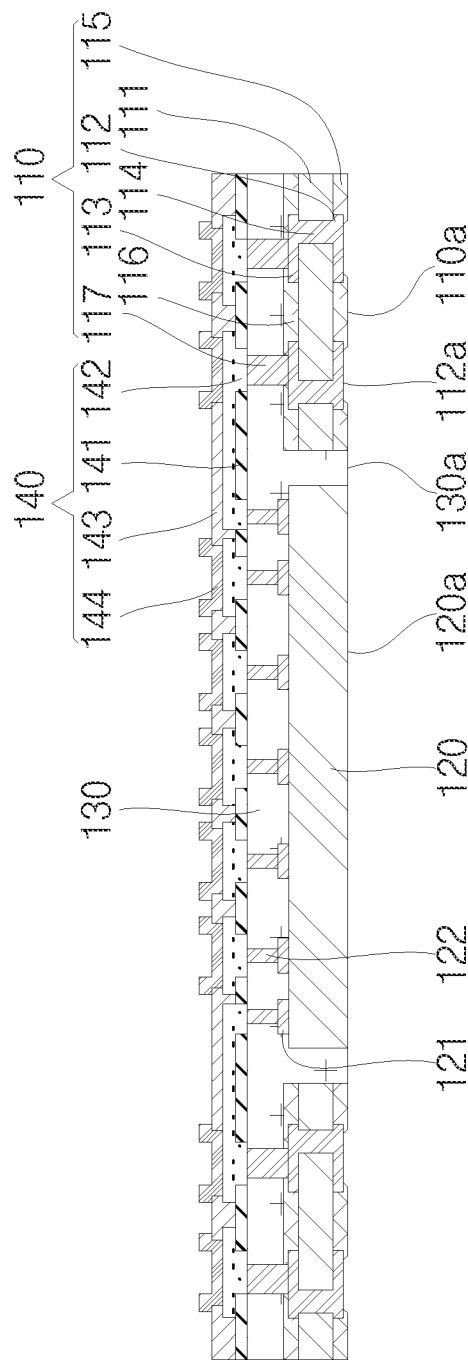

FIG. 2F shows a cross-sectional view of semiconductor device 100 at a later stage of manufacture. In the example shown in FIG. 2F, carrier 10 can be removed from bottom surface 110a of substrate 110, bottom surface 120a of electronic component 120 and bottom surface 130a of encapsulant 130. In a state in which temporary bond layer 11 is attached to carrier 10, carrier 10 can be removed from substrate 110, electronic component 120, and encapsulant 130. In some examples, adhesion of temporary bond layer 11 can be removed or weakened by supplying heat, light, a chemical solution, or a physical external force. Accordingly, bottom surface 110a of substrate 110, bottom surface 120a of electronic component 120, and bottom surface 130a of encapsulant 130 can be exposed. In addition, bottom surfaces 112a of substrate lands 112 can also be exposed.

Figure 2G:
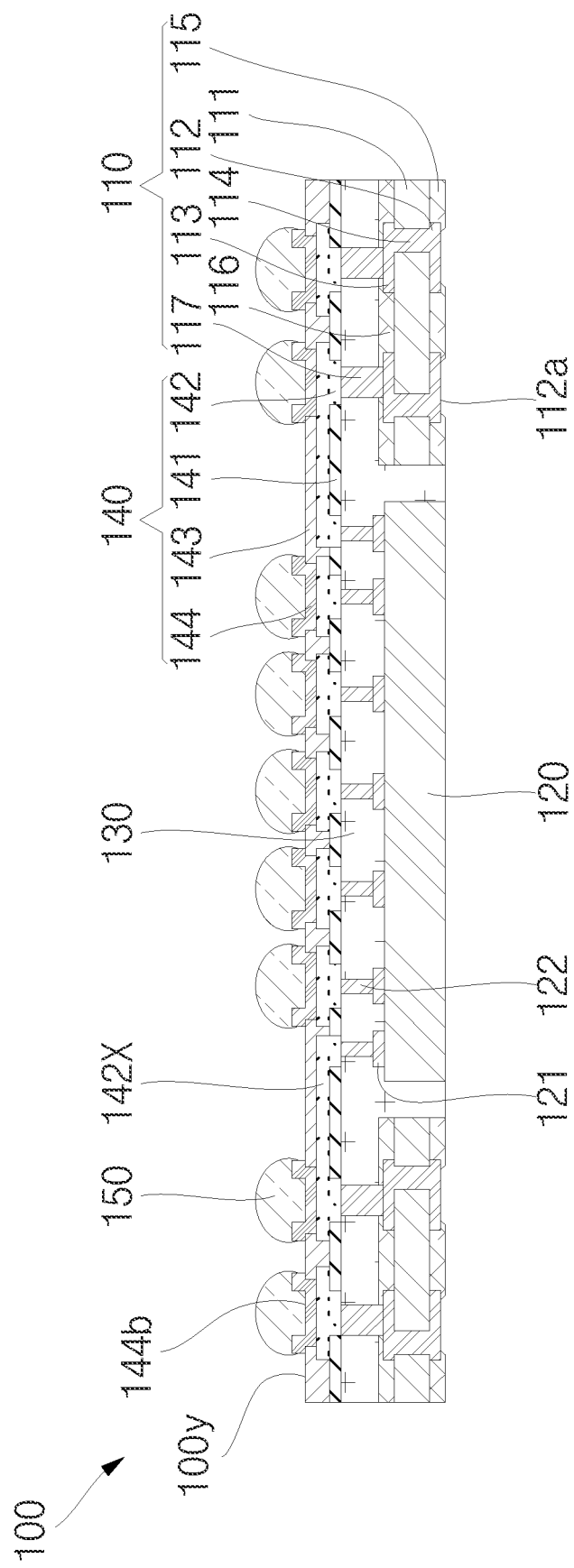

FIG. 2G shows a cross-sectional view of semiconductor device 100 at a later stage of manufacture. In the example shown in FIG. 2G, external interconnects 150 can be provided on top surface 144b of second conductive structure 144. External interconnects 150 can be electrically connected to top surface 144b of second conductive structure 144. External interconnects 150 can be electrically connected to substrate 110 through redistribution structure 140 and substrate interconnects 117, or to electronic component 120 through redistribution structure 140 and component interconnects 122. In addition, external interconnects 150 can be electrically connected to both substrate 110 and electronic component 120 through conductors 142X of redistribution structure 140.

In some examples, external interconnects 150 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. External interconnects 150 can be formed by, for example, ball dropping, screen printing, or electroplating. For example, external interconnects 150 can be formed by forming a conductive material containing solder on top surface 144b of second conductive structure 144 of redistribution structure 140 by ball dropping, followed by performing a reflow process. External interconnects 150 can comprise or be referred to as conductive balls, such as solder balls, conductive pillars, such as copper pillars, or conductive posts having solder caps formed on copper pillars. External interconnects 150 can have a size in the range from approximately 0.1 mm to approximately 0.5 mm. Additionally, completed semiconductor device 100 can be flipped, and external interconnects 150 can be positioned on bottom surface 100y of substrate 100 of semiconductor device 100. In some examples, external interconnects 150 can comprise or be referred to as external input/output terminals of semiconductor device 100.

Figure 5:
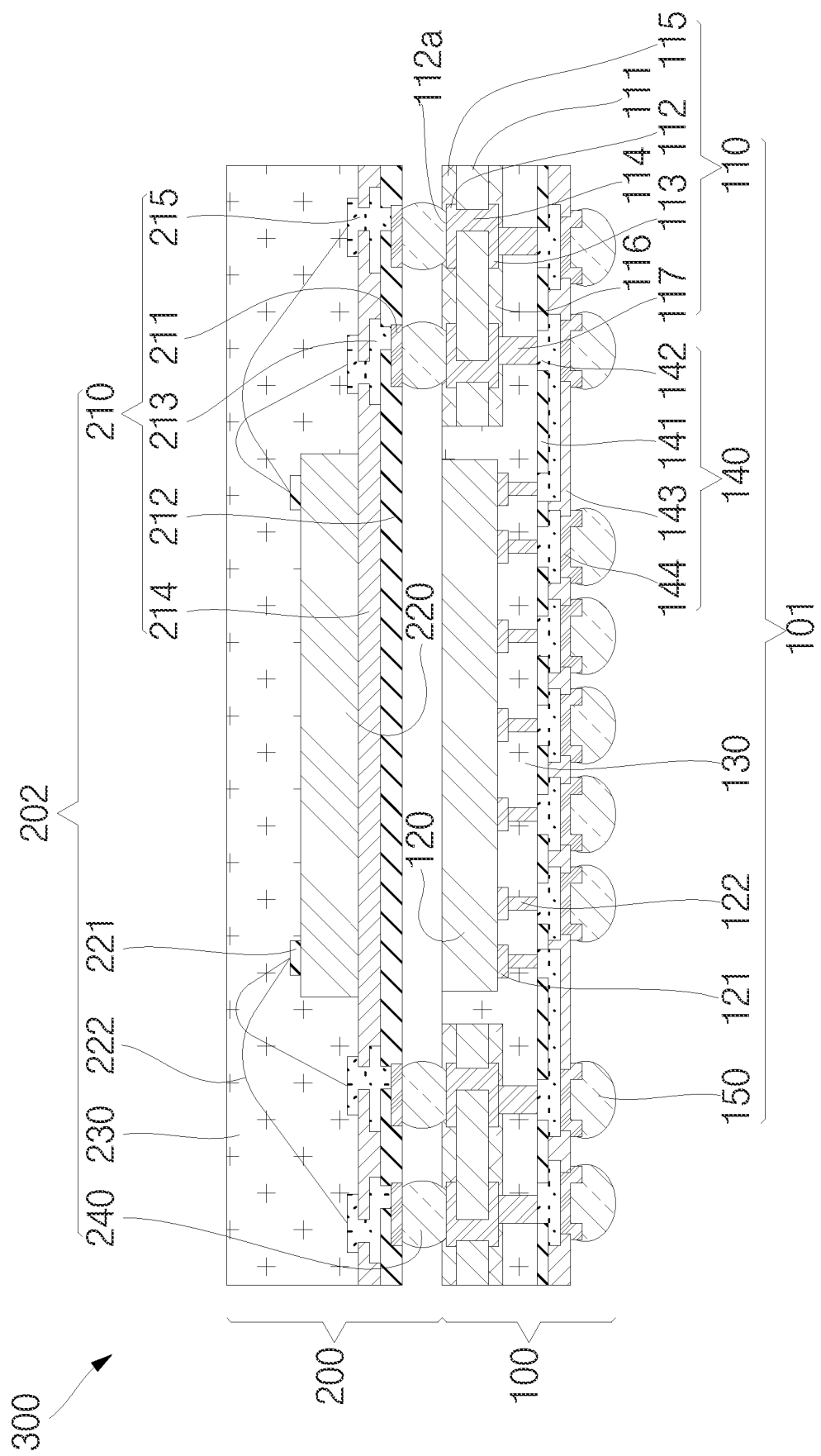
FIG. 5 shows a cross-sectional view of an example semiconductor device.

Referring now to FIG. 5, a cross-sectional view of an example semiconductor device 300 is shown. In the example shown in FIG. 5, semiconductor device 300 can comprise first semiconductor device 100 and a second semiconductor device 200. First semiconductor device 100 can be the same with semiconductor device 100 shown in FIG. 1. Second semiconductor device 200 can comprise substrate 210, electronic component 220, encapsulant 230, and interconnects 240. First semiconductor device 100 can comprise redistribution structure 140 comprising conductive structure 142 or 144, a first substrate 110 on a top side of redistribution structure 140 and having a cavity 119 and a pillar contacting redistribution structure 140. Electronic component 120 can be on the top surface of redistribution structure 140 and in the cavity 119, wherein the electronic component 120 can be electrically coupled with the conductive structure 142 or 144 via a component interconnect 122. An encapsulant 130 can be in the cavity 119 and on the top side of redistribution structure 140 bounding a lateral side of the electronic component 120 and the pillar 117.

The second semiconductor device 200 can be on a top side of the first semiconductor device 100, wherein the second semiconductor device 200 can be electrically coupled with a substrate land 112 on the top side of the first semiconductor device 100. Referring to the second semiconductor device 200, substrate 210 can comprise dielectric layers 212 and 214 and conductive layers 211, 213 and 215. Electronic component 220 can comprise terminals 221 and internal interconnects 222. Substrate 210, encapsulant 230, and interconnects 240 can comprise or be referred to as a semiconductor package 202 and can provide protection for electronic component 220 from external elements or environmental exposure. In addition, semiconductor package 202 can provide electrical couplings between an external component and electronic component 220.

Figure 6A:
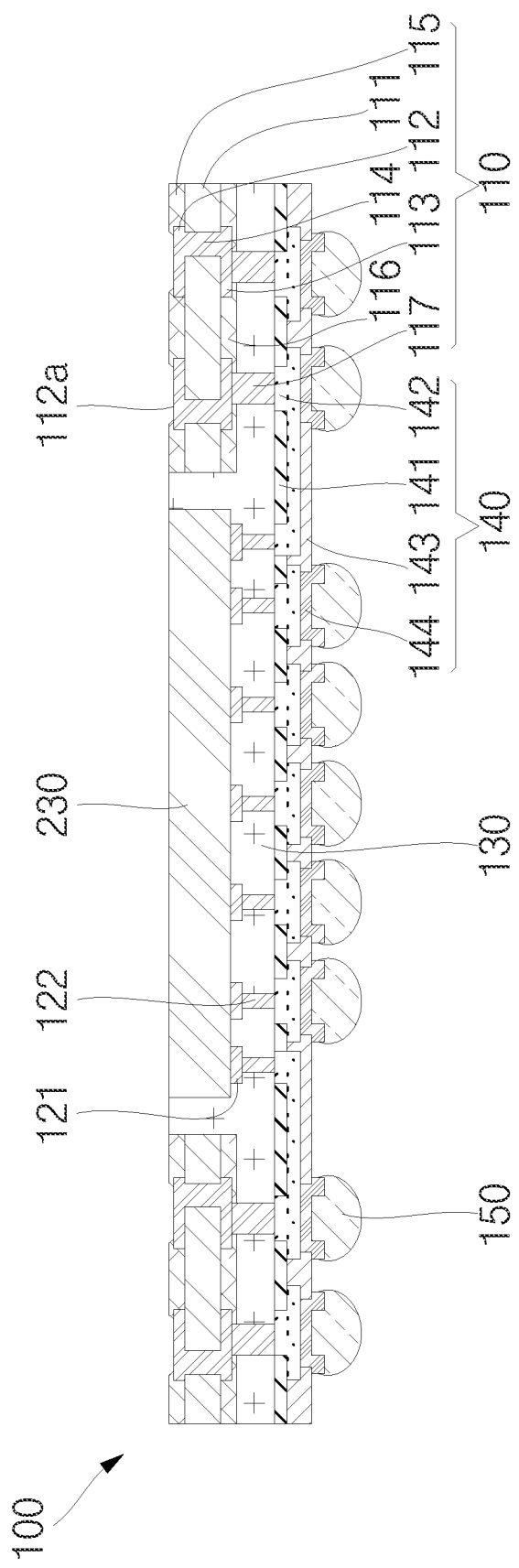
FIG. 6A and FIG. 6B show cross-sectional views of an example method for manufacturing an example semiconductor device.
Figure 6B:
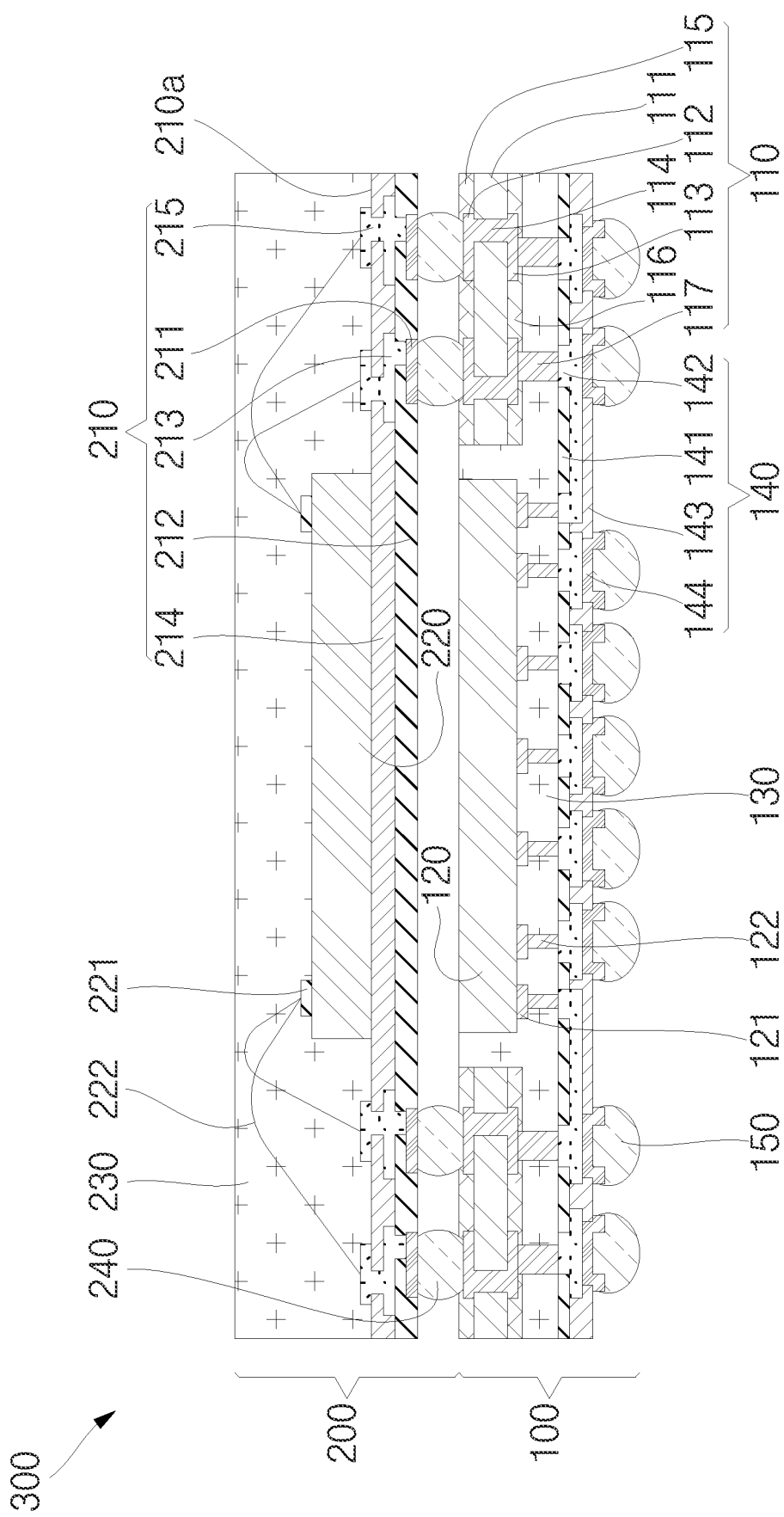

FIGS. 6A and 6B show cross-sectional views of an example method for manufacturing an example semiconductor device. FIG. 6A shows a cross-sectional view of semiconductor device 300 at an early stage of manufacture.

In the example shown in FIG. 6A, semiconductor device 100 can be prepared. Example method for manufacturing first semiconductor device 100 shown in FIG. 6A can be similar to the example method for manufacturing semiconductor device 100 shown in FIGS. 2A to 2G, FIGS. 3A to 3C, and FIGS. 4A and 4B.

In the example shown in FIG. 6A and FIG. 6B, interconnects 240 of second semiconductor device 200 can be electrically connected to top surfaces 112a of substrate lands 112 of first semiconductor device 100. Second semiconductor device 200 can be stacked on first semiconductor device 100.

In some examples, pick-and-place equipment (not shown) can pick up second semiconductor device 200 to place second semiconductor device 200 on top surfaces 112a of substrate lands 112 of first semiconductor device 100. Subsequently, second semiconductor device 200 can be electrically connected to first semiconductor device 100 by mass reflow, thermal compression, or laser assist bonding.

In substrate 210 of second semiconductor device 200, conductive structures 211, 213, and 215 having a multitude of conductors, traces, or patterns can be provided within dielectric layers 212 and 214. Substrate 210 is shown comprising three conductive structures 211, 213 and 215 and two dielectric layers 212 and 214, but the number of conductive layers and dielectric layers of substrate 210 can be fewer or more. Substrate 210 can be similar to redistribution structure 120 or substrate 110 and can be similarly formed. Substrate 210 can comprise or be referred to as a redistribution structure, an interposer, or a printed circuit board.

In some examples, the non-active region of electronic component 220 can be adhered to a top surface of substrate 210 using an adhesive, and terminals 221 in an active region of electronic component 220 can be electrically connected to conductive layer 215 of substrate 210 through internal interconnectors 222 in the form of, for example, wires. In some examples, the active region of electronic component 220 can be located at its bottom surface and can be electrically connected to conductive structure 215 of substrate 210 in a flip-chip configuration through internal interconnectors 222 in the form of, for example, conductive bumps or conductive posts. Electronic component 220 can be similar to electronic component 120 and can be similarly formed as electronic component 120. Electronic component 220 can be electrically connected to interconnects 240 through internal interconnectors 222 and substrate 210.

Encapsulant 230 can be formed to cover both top surface 210a of substrate 210 and electronic component 220. Encapsulant 230 can be similar to encapsulant 130 and can be similarly formed as encapsulant 130.

Interconnects 240 can be electrically connected to conductive structure 211 of substrate 210. Conductive structures 211 can be similar to second conductive structure 144 and can be similarly formed as second conductive structure 144. Interconnects 240 can be similar to interconnects 150 and can be similarly formed as interconnects 150. Interconnects 240 can electrically connect substrate 210 and substrate 110 to each other. Interconnects 240 can be electrically connected to electronic component 220 through substrate 210. Interconnects 240 can be electrically connected to electronic component 120 through substrate 110 and redistribution structure 140. Interconnects 240 can electrically connect first semiconductor device 100 and second semiconductor device 200 to each other. Electronic component 220 can be electrically connected to interconnects 150 through substrate 210, interconnects 240, substrate 110, substrate interconnects 117 and redistribution structure 140.

The present disclosure includes reference to certain examples. It will be understood, however, by those skilled in the art that various changes may be made, and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A semiconductor structure, comprising:
a first semiconductor device comprising:
a redistribution structure comprising a conductive structure;
a first substrate on a top side of the redistribution structure and having a cavity and a pillar contacting the redistribution structure;
an electronic component on a top surface of the redistribution structure and in the cavity, wherein the electronic component is electrically coupled with the conductive structure via a component interconnect; and
an encapsulant in the cavity and on the top side of the redistribution structure bounding a lateral side of the electronic component and the pillar; and
a second semiconductor device on a top side of the first semiconductor device, wherein the second semiconductor device is electrically coupled with a substrate land on a top side of the first substrate;
wherein the encapsulant comprises a single continuous structure between an active side of the electronic component and the redistribution structure.

2. The semiconductor structure of claim 1, wherein the second semiconductor device comprises a second substrate, a second electronic component on a top side of the second substrate, and a second encapsulant on the top side of the second substrate contacting a lateral side of the second electronic component.

3. The semiconductor structure of claim 1, wherein the redistribution structure comprises a redistribution layer substrate, and the first substrate comprises a pre-formed substrate.

4. The semiconductor structure of claim 1, wherein the pillar of the first semiconductor device comprises a conductive post electrically coupled with the conductive structure of the redistribution structure and the substrate land.

5. The semiconductor structure of claim 1, wherein the first substrate bounds the electronic component on at least two lateral sides.

6. The semiconductor structure of claim 1, wherein the encapsulant is between the electronic component and the redistribution structure and between the first substrate and the redistribution structure.

7. The semiconductor structure of claim 1, wherein the encapsulant contacts a lateral side of component interconnect and a lateral side of the pillar.

8. A method to manufacture a semiconductor structure, comprising:
   providing a first semiconductor device comprising:
      a redistribution structure comprising a conductive structure;
      a first substrate on a top side of the redistribution structure and having a cavity and a pillar contacting the redistribution structure;
      an electronic component on a top surface of the redistribution structure and in the cavity, wherein the electronic component is electrically coupled with the conductive structure via a component interconnect; and
      an encapsulant in the cavity and on the top side of the redistribution structure bounding a lateral side of the electronic component and the pillar; and
   providing a second semiconductor device on a top side of the first semiconductor device, wherein the second semiconductor device is electrically coupled with a substrate land on a top side of the first substrate;
   wherein the encapsulant comprise a single continuous structure between an active side of the electronic component and the redistribution structure.

9. The method of claim 8, wherein the second semiconductor device comprises:
   a second substrate;
   a second electronic component on a top side of the second substrate; and
   a second encapsulant on the top side of the second substrate contacting a lateral side of the second electronic component.

10. The method of claim 8, wherein:
   the redistribution structure comprises a redistribution layer substrate; and
   the first substrate comprises a pre-formed substrate.

11. The method of claim 8, wherein the pillar of the first semiconductor device comprises a conductive post electrically coupled with the conductive structure of the redistribution structure and the substrate land.

12. The method of claim 8, wherein the first substrate bounds the electronic component on at least two lateral sides.

13. The method of claim 8, wherein the encapsulant is between the electronic component and the redistribution structure and between the first substrate and the redistribution structure.

14. The method of claim 8, wherein the encapsulant contacts a lateral side of component interconnect and a lateral side of the pillar.

15. A semiconductor structure, comprising:
   a redistribution structure comprising a first conductive structure and a second conductive structure;
   a cavity substrate over the redistribution structure, wherein the cavity substrate has a cavity and a substrate interconnect coupled with the first conductive structure;
   an electronic component over the redistribution structure and in the cavity, wherein the electronic component has a component interconnect coupled with the first conductive structure; and
   an encapsulant over the redistribution structure and in the cavity, wherein the encapsulant contacts a lateral side of the electronic component;
   wherein the first conductive structure is within the redistribution structure and a first portion of the second conductive structure extends external to the redistribution structure; and
   wherein the encapsulant comprises a single continuous structure between an active side of the electronic component and the redistribution structure.

16. The semiconductor structure of claim 15, further comprising an external interconnect coupled with the first portion of the second conductive structure that is external to the redistribution structure.

17. The semiconductor structure of claim 15, wherein the first conductive structure is coupled with the second conductive structure.

18. The semiconductor structure of claim 15, wherein the redistribution structure comprises a first dielectric structure and a second dielectric structure.

19. The semiconductor structure of claim 18, wherein the first conductive structure is between the first dielectric structure and the second dielectric structure.

20. The semiconductor structure of claim 15, wherein the component interconnect has a single width, and the single width of the component interconnect is less than a width of the substrate interconnect.

21. The semiconductor structure of claim 15, wherein the substrate interconnect comprises a copper post.

22. The semiconductor structure of claim 15, wherein the encapsulant is between the redistribution structure and the cavity substrate.

23. The semiconductor structure of claim 15, wherein the encapsulant contacts a lateral side of component interconnect and a lateral side of the substrate interconnect.

* * * * *